(12) United States Patent
Inumiya et al.

(10) Patent No.: US 6,294,481 B1
(45) Date of Patent: Sep. 25, 2001

(54) SEMICONDUCTOR DEVICE AND METHOD FOR MANUFACTURING THE SAME

(75) Inventors: Seiji Inumiya; Yoshio Ozawa, both of Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/232,849

(22) Filed: Jan. 19, 1999

(30) Foreign Application Priority Data

Jan. 19, 1998 (JP) .................................................. 10-008009

(51) Int. Cl.[7] .................................................. H01L 21/3115
(52) U.S. Cl. ........................ 438/766; 438/528; 438/296; 438/424
(58) Field of Search ..................................... 438/218, 221, 438/294, 296, 423, 424, 528, 766, FOR 158, FOR 494, FOR 227

(56) References Cited

U.S. PATENT DOCUMENTS

| | | | |
|---|---|---|---|
| 4,923,821 | * | 5/1990 | Namose . |
| 5,885,883 | * | 3/1999 | Park et al. . |
| 6,080,682 | * | 6/2000 | Ibok . |
| 6,081,662 | * | 6/2000 | Murakami et al. . |
| 6,087,214 | * | 7/2000 | Cunningham . |
| 6,090,682 | * | 7/2000 | Lim . |
| 6,100,160 | * | 8/2000 | Hames . |
| 6,107,143 | * | 8/2000 | Park et al. . |
| 6,110,784 | * | 8/2000 | Gardner et al. . |
| 6,127,718 | * | 10/2000 | Okayama et al. . |

FOREIGN PATENT DOCUMENTS 05-090254   4/1993  (JP) .

* cited by examiner

Primary Examiner—George Fourson
Assistant Examiner—Joannie Adelle Garcia
(74) Attorney, Agent, or Firm—Finnegan, Henderson, Farabow, Garrett, & Dunner, L.L.P.

(57) ABSTRACT

A semiconductor device is provided in which a lowering in the breakdown voltage of a gate insulating film (nitrided silicon oxide film) in a boundary region between the upper-end corner portion of the side wall of an element isolating groove and a silicon substrate in the end portion of an element forming region which is formed in contact therewith can be suppressed without causing an increase in the number of steps (time for effecting the steps). An element isolation insulating film is filled into the internal portion of the element isolating groove to cover the end portion of the silicon substrate in the element forming region which is formed in contact with the upper-end portion of the side wall of the element isolating groove, nitrogen is selectively doped into the surface of the silicon substrate in a region of the element forming region other than the end portion thereof with the element isolation insulating film used as a mask, then a portion of the element isolation insulating film lying outside the element isolating groove is removed to expose the upper-end portion of the side wall, and a nitrided silicon oxide film used as the gate insulating film is formed by the heat treatment in an atmosphere containing an oxidizing agent.

5 Claims, 7 Drawing Sheets

SEMICONDUCTOR DEVICE AND METHOD FOR MANUFACTURING THE SAME

BACKGROUND OF THE INVENTION

This invention relates to a semiconductor device using a silicon nitride film or silicon oxide film containing nitrogen as a gate insulating film and a method for manufacturing the same.

In order to enhance the performance of a semiconductor integrated circuit including MIS semiconductor elements and lower the cost thereof, it is important to miniaturize the elements and increase the integration density. Miniaturization of the elements is effected according to the design rule.

Further, in order to increase the integration density of the elements, it is important to not only reduce the size of the elements but also reduce the size of the element isolating region. As the effective technique for miniaturizing the size of the element isolating region, a trench type element isolation (STI:Shallow Trench Isolation) technique is known.

When a MOS transistor using a polysilicon film containing boron as a gate electrode is miniaturized, it is necessary to use a nitrided silicon oxide film (which is a silicon oxide film containing nitrogen) as a gate insulating film in order to prevent boron from being diffused into the silicon substrate. It is necessary to simultaneously supply an oxidizing agent and nitriding agent in order to form a thinner nitrided silicon oxide film.

Next, a method for manufacturing the MOS transistor using the above gate insulating film (nitrided silicon oxide film) is explained with reference to FIGS. 9A to 9H. These figures show cross sections of the MOS transistor taken along a line passing across the gate electrode and set in parallel to the gate length direction.

First, as shown in FIG. 9A, a silicon oxide film 82 with a thickness of 10 nm is formed on the (100) surface of a silicon substrate 81 by use of a thermal oxidation method. Then, as shown in FIG. 9A, a silicon nitride film 83 with a thickness of 200 nm is formed on the silicon oxide film 82 by use of the LPCVD method.

Next, as shown in FIG. 9B, trench type shallow element isolation grooves 84 are formed in the surface of the silicon substrate 81 by sequentially etching the silicon nitride film 83, silicon oxide film 82 and silicon substrate 81.

In more detail, a photoresist pattern (not shown) which defines an element forming region (active area) is formed on the silicon nitride film 83 and the pattern of the photoresist pattern is transferred onto the silicon nitride film 83 by etching the silicon nitride film 83 by use of an RIE method with the photoresist pattern used as a mask.

Next, after the photoresist pattern is removed, the element isolation grooves 84 are formed by sequentially etching the silicon oxide film 82 and the silicon substrate 81 by use of the RIE method with the silicon nitride film 83 used as a mask.

After this, as shown in FIG. 9C, a silicon oxide film 85 with a thickness of 15 nm is formed on the exposed surface of the silicon substrate 81 by use of a thermal oxidation method.

Next, as shown in FIG. 9D, an element isolation insulating film 86 is filled in the internal portions of grooves formed by the element isolation grooves 84 as well as the silicon nitride film 83 and silicon oxide film 82 lying thereon, and then the surface of the structure is made flat.

In more detail, a silicon oxide film used as the element isolation insulating film 86 is formed on the entire surface by use of the LPCVD method so as to fill the grooves formed of the element isolation grooves 84 and the silicon nitride film 83 lying thereon, then the silicon film is polished by use of the CMP method until the surface of the silicon nitride film 83 is exposed. As a result, the structure as shown in FIG. 9D is obtained.

Next, as shown in FIG. 9E, the element isolation insulating film (silicon oxide film) 86 is retreated to substantially the surface portion of the silicon substrate 81 by use of an ammonium fluoride solution and the silicon nitride film 83 is removed by use of a hot phosphoric acid, then the silicon oxide film 82 is removed by use of a dilute hydrofluoric acid to expose the surface of the silicon substrate 81 (active area) in the element forming region.

Next, for example, as shown in FIG. 9F, an oxidizing-nitriding process is effected at 850° C. by use of dinitrogen monoxide gas, to form a nitrided silicon oxide film (gate insulating film) 87 with a thickness of 4 nm on the exposed surface of the silicon substrate 81 and then an amorphous silicon film 88 with a thickness of 100 nm, which contains boron as impurity with high impurity concentration and which will be used as a gate electrode, is formed by use of the LPCVD method.

After this, like a conventional MOS transistor manufacturing method, the processes for patterning the gate electrode, for forming source and drain diffusion layers and for forming wirings are effected to complete a MOS transistor.

However, this type of MOS transistor manufacturing method has the following problem.

As shown in FIG. 9G, the portion of the nitrided silicon oxide film (gate insulating film) 87 lying on the upper-end corner portion of the side wall of the element isolation groove 84 is not so thick as the portion of the same lying on the element forming region. Therefore, the breakdown voltage of the nitrided silicon oxide film (gate insulating film) 87 on the upper-end corner portion of the side wall of the element isolation groove 84 in which the electric field is concentrated becomes low and thus the reliability is lowered.

Further, in the thermal oxidation method, which is a conventional method for forming a normal gate insulating film, the oxidation rate varies on the (100) face and the (110) face which correspond to the side wall surface of the element isolating groove 84, (the rate on the (110) face is about 1.5 times greater than that on the (100) face) and therefore, as shown in FIG. 9H, the film thickness of the thermal silicon oxide film (gate insulating film) 87 at the upper-end corner portion of the side wall of the element isolation groove 84 is greater than the film thickness of the thermal silicon oxide film (gate insulating film) 87 in the element forming region. A high breakdown voltage of the thermal silicon oxide film (gate insulating film) 87 is therefore attained and thus there have been no problems regarding a low reliability due to a low gate breakdown voltage. However, if a dinitrogen monoxide gas is employed, both oxidation and nitration may occur, and thus the difference of oxidation rate on the (100) face and the (110) face may be reduced.

In order to solve the problem of a lowering in the breakdown voltage of the nitrided silicon oxide film (gate insulating film) 87, a portion of the nitrided silicon oxide film (gate insulating film) 87 at the above-mentioned corner portion, that is, a portion lying between the upper-end corner portion of the side wall of the element isolation groove 84 and the end portion of the element forming region formed in contact therewith may be made thicker than a portion of the nitrided silicon oxide film (gate insulating film) 87 which lies on the central flat portion of the element forming region.

Such a technique for forming a gate insulating film having different film thickness on different regions of the substrate is known in the prior art (refer to Japanese Patent Application No. 3-249810).

However, if this type of conventional technique is used, it will be necessary to use the photolithography in order to mask the corner portion, and therefore, additional steps (additional time for effecting the steps) and additional manufacturing costs will be necessary.

Further, a problem of misalignment may occur and it is therefore difficult to form a thick gate insulating film on the corner portion without fault.

As described above, in a MOS transistor using the nitrided silicon oxide film as the gate insulating film, it has been considered that a nitrided silicon oxide film is formed so as to have a thin part on the central flat portion of the element forming region as designed and a thick part on the corner portion, to prevent a lowering in the breakdown voltage of the gate insulating film in the corner portion.

However, such a conventional method for forming the gate insulating film having different film thickness on the different regions of the substrate requires the photolithography.

Therefore, there occur problems that additional steps (additional time for effecting the steps) as well as additional manufacturing costs will be needed and it is difficult to form a thick gate insulating film on the corner portion without fault, due to misalignment.

BRIEF SUMMARY OF THE INVENTION

This invention has been achieved in consideration of the above problems. An object of the present invention is to provide a semiconductor device having a gate insulating film which is formed of a silicon nitride film or silicon oxide film containing nitrogen, which is formed in a self-alignment manner, and which can prevent deterioration of the breakdown voltage in a boundary region defined between an element forming region and an element isolating region, and to provide a method for manufacturing the same.

According to the first aspect of the present invention, there is provided a semiconductor device comprising a silicon substrate including an element forming region, an element isolating region, and a boundary region defined between the element forming region and the element isolating region, including the boundary between the element forming region and the element isolating region, and a gate insulating film formed on the surface of the silicon substrate to extend from the element forming region to the element isolating region across the boundary region, wherein the gate insulating film includes either of a silicon nitride film or a silicon oxide film containing nitrogen and is formed in a self-alignment manner to make the thickness of the gate insulating film on the boundary region greater than the thickness of the gate insulating film in the regions other than the boundary region.

According to the second aspect of the present invention, there is provided a method for manufacturing a semiconductor device, comprising the steps of dividing the silicon substrate into the element forming region and the element isolating region, doping nitrogen into the surface of the silicon substrate in the element forming region, and forming the gate insulating film on the surface of the silicon substrate so that the gate insulating film can extend from the element forming region to the element isolating region across the boundary region, by the heat treatment in an atmosphere containing an oxidizing agent.

According to the third aspect of the present invention, there is provided a method for manufacturing the semiconductor device, comprising the steps of dividing a silicon substrate into an element forming region and an element isolating region, doping nitrogen into the surface of the silicon substrate in the boundary region, and forming a silicon nitride film or a silicon oxide film containing nitrogen as the gate insulating film so that the gate insulating film can extend on the surface of the silicon substrate from the element forming region to the element isolating region across the boundary region.

According to the fourth aspect of the present invention, there is provided a method for manufacturing the semiconductor device, wherein the silicon substrate is a crystalline silicon substrate, and the method comprises the steps of dividing the crystalline silicon substrate into an element forming region and an element isolating region, selectively forming the surface of the silicone substrate in the boundary region into an amorphous form, and forming the silicon nitride film or the silicon oxide film containing nitrogen as the gate insulating film by use of a nitriding method, so that the gate insulating film can extend from the element forming region to the element isolating region across the boundary region.

It is preferable to use an insulating film of a laminated structure including a silicon nitride film as the gate insulating film.

In the methods for manufacturing the semiconductor device according to this invention, it is preferable to perform the step of doping nitrogen into the surface of the silicon substrate by use of, for example, a thermal nitriding method using nitriding agent gas such as nitrogen monoxide gas or ammonium gas, a radical nitriding method using active nitrogen atoms, or an ion implantation method using nitrogen ion.

Further, in the methods for manufacturing the semiconductor device according to this invention, it is preferable to form a chemically grown film on a region other than the boundary region of the element forming region before the gate insulating film is formed by use of the nitriding method, Further, in the methods for manufacturing the semiconductor device according to this invention, it is preferable to use ion of an inert element such as helium, neon, argon, krypton or xenon, nitrogen ion, oxygen ion or silicon ion as the ion implanted into the surface of the silicon substrate.

According to this invention, in the semiconductor device using the silicon nitride film or silicon oxide film containing nitrogen as the gate insulating film, since the film thickness of the gate insulating film in the boundary region defined between the element forming region and the element isolating region is greater than the film thickness of the gate insulating film in the element forming region, a lowering in the breakdown voltage in the boundary region can be suppressed.

Further, since the gate insulating film can be formed in the self-alignment manner by the manufacturing method of this invention, the number of steps (time for effecting the steps) and the manufacturing cost can be reduced and the film of a sufficient thickness in the boundary region can be stably provided.

According to this invention, since nitrogen is doped into the surface of the silicon substrate in which the film thickness is made small and nitrogen is not doped into the surface of the silicon substrate in which the film thickness is made large, the gate insulating film (silicon oxide film containing nitrogen, silicon nitride film) having different film thickness can be formed in a self-alignment manner by the heat treatment in an atmosphere containing an oxidizing agent.

Further, according to this invention, since nitrogen is not doped into the surface of the silicon substrate in which the film thickness is small and nitrogen is doped into the surface of the silicon substrate in which the film thickness is large, the gate insulating film (silicon oxide film containing nitrogen, silicon nitride film) having different film thickness can be formed in a self-alignment manner by use of the deposition method.

Further, according to this invention, in the area where nitrogen is not doped into the surface of the silicon substrate, the film thickness is made small while in the area where nitrogen is doped into the surface of the silicon substrate, the film thickness is made large. Hence, the gate insulating film (silicon oxide film containing nitrogen, silicon nitride film) having different film thickness can be formed in a self-alignment manner by use of the nitriding method.

Further, according to this invention, since the surface of the silicon substrate in which the film thickness is made small is kept in the single crystal form and the surface of the silicon substrate in which the film thickness is made large is formed into the amorphous form, the gate insulating film (silicon oxide film containing nitrogen, silicon nitride film) having different film thickness can be formed in a self-alignment manner by use of the nitriding method. =p Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

There will now be described embodiments of this invention with reference to the accompanying drawings.

First Embodiment

FIGS. 1A to 1J are cross sectional views showing the steps of a method for manufacturing a MOS transistor according to a first embodiment of this invention. Those figures show cross sections taken along a line passing across the gate electrode and set in parallel to the gate length direction.

Figure 1A:
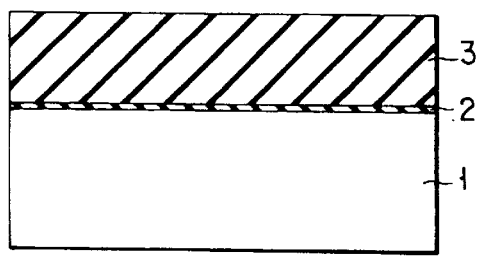
FIGS. 1A to 1J are cross sectional views showing the steps of a method for manufacturing a MOS transistor according to the first embodiment of this invention.

First, as shown in FIG. 1A, a silicon oxide film 2 with a thickness 10 nm is formed on the (100) surface of a single crystal silicon substrate 1 by use of a thermal oxidizing method. Then, as shown in FIG. 1A, a silicon nitride film 3 of 200 nm thickness is formed on the silicon oxide film 2 by use of an LPCVD method.

Figure 1F:
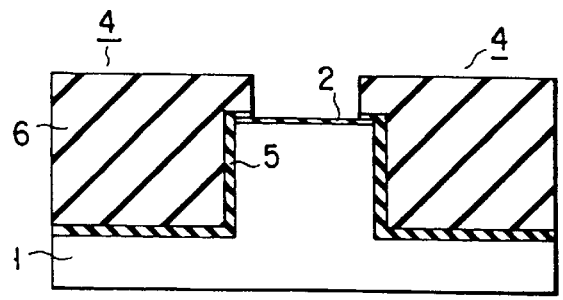
Figure 1B:
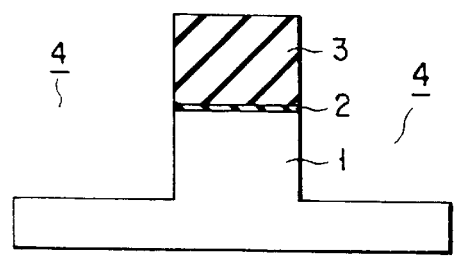

Next, as shown in FIG. 1B, trench type shallow element isolating grooves 4 are formed in the surface of the silicon substrate 1 by sequentially etching the silicon nitride film 3, silicon oxide film 2 and silicon substrate 1.

In more detail, a photoresist pattern (not shown) which defines an element forming region (active area) is formed on the silicon nitride film 3 and the pattern of the photoresist pattern is transferred onto the silicon nitride film 3 by etching the silicon nitride film 3 by use of an RIE method with the photoresist pattern used as a mask.

Next, after the photoresist pattern is removed, the element isolating grooves 4 are formed by sequentially etching the silicon oxides film 2 and silicon substrate 1 by use of the RIE method with the silicon nitride film 3 used as a mask.

Figure 1G:
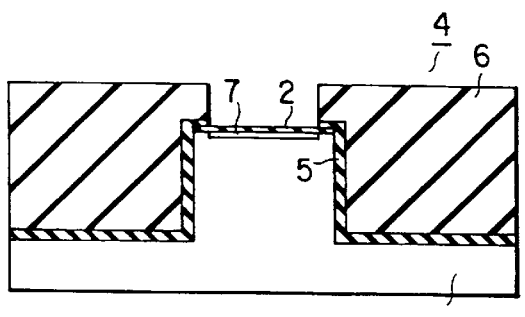
Figure 1C:
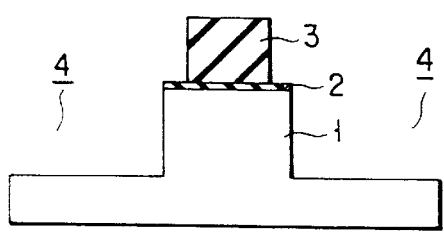

After this, as shown in FIG. 1C, the exposed surface of the silicon nitride film 3 is retreated by 20 nm by use of a hot phosphoric acid.

Figure 1H:
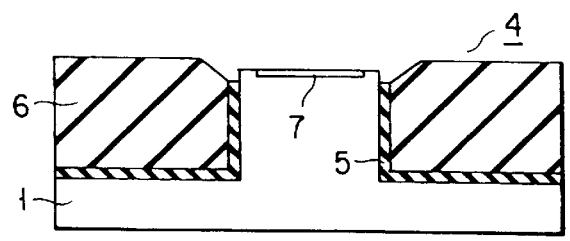
Figure 1D:
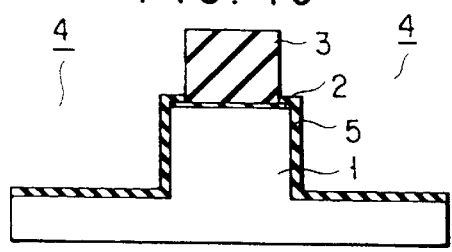

Next, as shown in FIG. 1D, a silicon oxide film 5 with a thickness of 15 nm is formed on the surface of a portion of the silicon substrate 1 which is not covered with the silicon nitride film 3 by use of a thermal oxidation method.

Figure 1I:
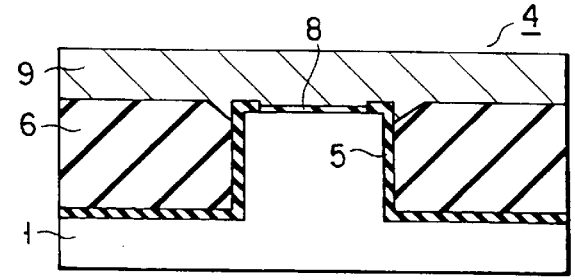
Figure 1E:
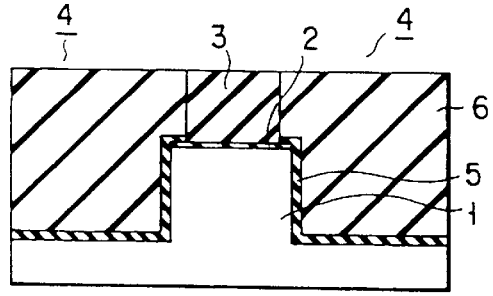

Then, as shown in FIG. 1E, an element isolation insulating film 6 is filled in the internal portions of grooves formed of the element isolation grooves 4 and the silicon nitride film 3 and silicon oxide film 2 lying thereon. Then, the surface of the structure is made flat.

In more detail, after a silicon oxide film with a thickness of 500 nm used as the element isolation insulating film 6 is formed on the entire surface by use of the LPCVD method to fill the internal portions of the grooves formed of the element isolation grooves 4 and the silicon nitride film 3 and the like lying thereon, the structure as shown in FIG. 1E is provided by polishing the silicon film by use of the CMP method until the surface of the silicon nitride film 3 is exposed.

Next, as shown in FIG. 1F, after the surface of the element isolation insulating film (silicon oxide film) 6 is retreated by use of an ammonium fluoride solution, the silicon nitride film 3 is removed by use of a hot phosphoric acid.

Next, as shown in FIG. 1G, nitrogen is doped into the surface of the central flat portion of the silicon substrate 1 in the element forming region, from which the silicon nitride film 3 has been removed, by use of the ion-implantation technique using nitrogen ion. In FIG. 1G, a reference numeral 7 indicates a region in which nitrogen is doped (nitrogen doped region).

Introduction of nitrogen may be implemented by use of the thermal nitriding method using nitriding agent gas such as $NH_3$ gas, $N_2O$ gas, NO gas or, by use of the radical nitriding method employing a nitrogen radical, for example.

Those nitrogen introduction methods make it possible to dope nitrogen into the surface of the silicon substrate 1 even in the case where the surface of the silicon substrate 1 is covered with the silicon oxide film 2.

Particularly, when the radical nitriding method is used, introduction of nitrogen can be effected even at low temperatures, for instance in the range between a room temperature and 700° C., so that occurrence of a variation in the impurity profile in the channel region can be prevented and a fluctuation in the threshold voltage can be prevented.

When the ion implantation technique (the acceleration voltage used therefor may be, for example, in the range between 5 KeV and 10 KeV) is used, nitrogen introduction with higher concentration can be achieved. As a result, a gate insulating film having a larger difference in the film thickness can be provided in the next step as shown in FIG. 1I. In this step, it is preferable to make the concentration of nitrogen lower than $10^{15}$ cm$^{-2}$, in consideration of affects to the crystal structure of the silicon substrate.

Next, as shown in FIG. 1H, a portion of the silicon substrate 1 in the element forming region and a portion of the silicon substrate 1 in the boundary region corresponding to the upper-end corner portion of the element isolating groove 4 are exposed by retreating the surface of the element isolation insulating film (silicon oxide film) 6 to substantially the same height of the surface of the silicon substrate and removing the silicon oxide film 2 by use of a dilute hydrofluoric acid.

Next, as shown in FIG. 1I, a nitrided silicon oxide film (gate insulating film) 8 is formed on the surface of the silicon substrate 1 by effecting an oxidizing-nitriding process at 850° C. by use of dinitrogen monoxide gas, for example.

Figure 2:
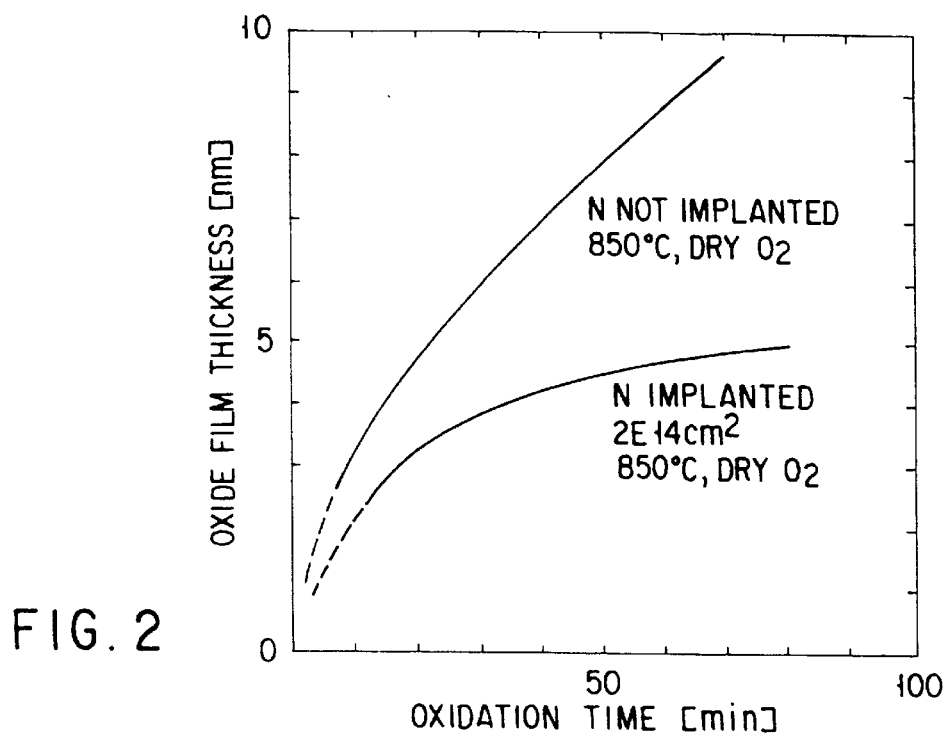
FIG. 2 is a graph showing curves of oxide thickness for oxidation time in a case where nitrogen is implanted and a case where nitrogen is not implanted.

Since the growth rate of an oxide film on an area of silicon substrate surface where nitrogen is doped is different from that of an area where nitrogen is not doped, there will be a thickness difference between those two areas. FIG. 2 shows, as an example, the relation between the oxidation time and the thickness of an oxide film formed on the (100) face in the case where nitrogen is implanted, and that in the case where nitrogen is not implanted. In this example, the process is conducted with a nitrogen ion dose amount of $2 \times 10^{14}$ cm$^{-2}$ at a temperature of 850° C. According to the example of this figure, assuming that the oxidation time is 30 minutes, the oxides film on the area where nitrogen has been implanted will be about 4 nm in thickness, while that on the area where nitrogen is not implanted will be 6 nm in thickness.

Figure 1J:
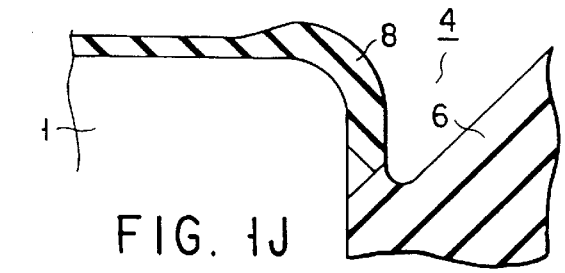

That is, if the oxide film is provided under the condition as mentioned above, the nitrided silicon oxide film (gate insulating film) 8 of 4 nm thickness will be formed on the central flat portion of the silicon substrate 1 in the element forming region, while the nitrided silicon oxide film (gate insulating film) 8 with a larger thickness of 6 nm will be provided in the boundary region including the upper-end corner portion of the side wall of the element isolating groove 4 and the end portion (a region in which nitrogen is not doped) of the element forming region formed in contact therewith, as shown in FIG. 1J.

If the heat treatment is carried out in an oxidizing gas atmosphere containing nitrogen such as a dinitrogen monoxide gas, instead of a dry oxygen, it is possible to form the gate insulating film 8 in a manner such that the thickness thereof on the corner portion where no nitrogen is doped is greater than that on a portion where nitrogen is doped, and therefore, the gate insulating film 8 containing nitrogen can be formed on the corner portion by effecting the heat treatment in an oxidizing gas atmosphere containing nitrogen as in this embodiment. Hence, the penetration of boron can be further effectively prevented.

That is, according to this embodiment of the invention, the nitrided silicon oxide film (gate insulating film) 8, the thickness of which at the corner portion is greater than that at the central flat portion in the element forming region can be formed in a self-alignment manner.

Therefore, the number of steps (time for effecting the steps) and the manufacturing cost can be reduced and a gate insulating film having a sufficient thickness in the boundary region can be stably provided.

Further, concentration of the electric field in the nitrided silicon oxide film (gate insulating film) 8 at the corner portion can be alleviated and the reliability of the nitrided silicon oxide film (gate insulating film) 8 is enhanced.

The stress applied on the nitrided silicon oxide film (gate insulating film) B lying near the interface with the silicon substrate 1 is reduced and the reliability is enhanced.

Next, as shown in FIG. 1I, an amorphous silicon film 9 with a thickness of 100 nm which contains boron as impurity with high impurity concentration and which will be used as a gate electrode is formed by use of the LPCVD method.

Note that the nitrogen contained in the nitrided silicon oxide film (gate insulating film) 8 will prevent the boron in the amorphous silicon film (gate electrode) 9 from diffusing into the silicon substrate 1, and as a result, a high-speed MOS transistor can be provided according to the original design.

Further, since nitrogen is contained in the nitrided silicon oxide film (gate insulating film) 8, the film thickness of the nitrided silicon oxide film (gate insulating film) B expressed in terms of the film thickness of the silicon oxide film is made smaller than the physical film thickness of the nitrided silicon oxide film (gate insulating film) B.

Therefore, even if the physical film thickness of the nitrided silicon oxide film (gate insulating film) 8 is made larger in order to enhance the reliability in the central flat portion of the silicon substrate 1 in the element forming region, it is still possible to provide a high-speed MOS transistor by using the present invention.

After this, like the normal MOS transistor manufacturing method, the processes for patterning the gate electrode, forming source and drain diffusion layers and forming wirings are effected to complete the MOS transistor.

This embodiment of the invention will be more advantageous if a damascene gate method (IEDM Tech (1998) pp 785) is used in combination with this embodiment for manufacturing a semiconductor device. In a case where the present invention and a damascene gate method are combined, the process for manufacturing a MOS transistor will be carried out in the following manner:

Firstly, the steps as shown in FIGS. 1A to 1H are done. Note that the element isolating film 6 is partially scooped away at the portions in contact with both side surfaces of the element forming region when the step shown in FIG. 1H is performed.

Figure 3A:
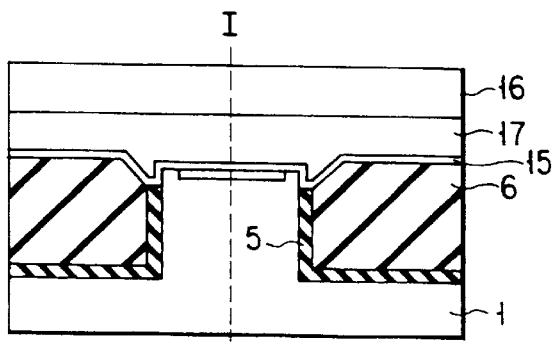
FIGS. 3A to 3F are cross sectional views showing the steps of a method for manufacturing a MOS transistor by using an embodiment of the present invention in combination with a damascene gate method.
Figure 3B:
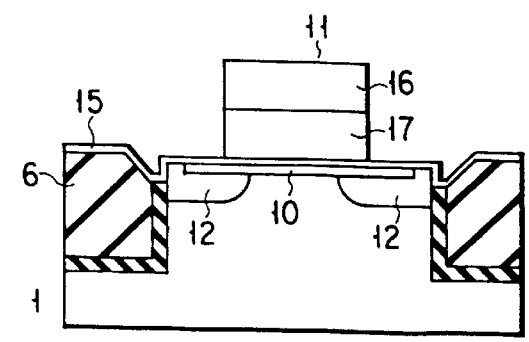
Figure 3C:
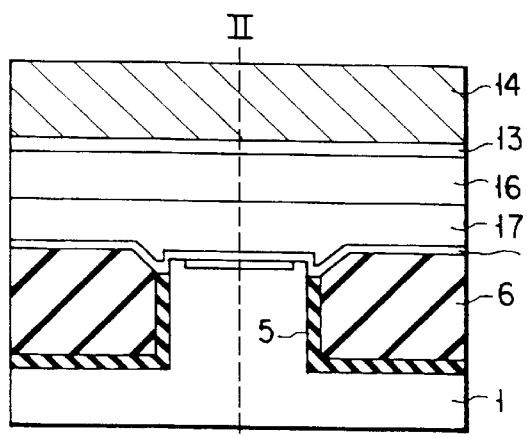
Figure 3D:
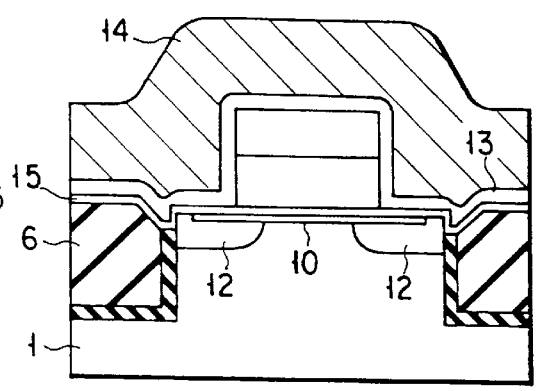
Figure 3E:
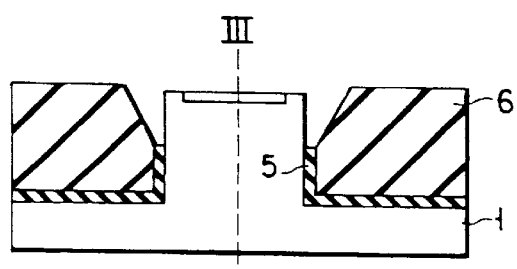

Next, wiring for gate electrodes is prepared by using a damascene gate method. The following process will be explained with reference to FIGS. 3A to 3F. FIGS. 3A, 3C, and 3C are cross sectional views of the MOS transistor taken along a line passing across the gate electrode and set in parallel to the gate length direction. FIGS. 3B, 3D, and 3E are cross sectional views taken along line I—I in FIG. 3A, line II—II in FIG. 3C, and line III—III in FIG. 3E, respectively.

Firstly, as shown in FIGS. 3A and 3B, dummy gate pattern 11, which is a silicon oxide film formed by an LPCVD method, is provided on the element forming region and on the element isolating region, with the silicon oxide film 15 formed by an LPCDV method being interposed. The dummy gate pattern 11 may be of laminated structure. In this embodiment, a laminated structure consisting of a silicon nitride layer 16 and an amorphous silicon layer 17 is used as the dummy gate pattern 11.

Next, after source/drain regions 12 are formed, silicon nitride film 13 is provided on the dummy gate pattern 11 and the surface of the source/drain regions. Further, an insulating film 14 is formed on the silicon nitride film 13 so as to have substantially the same height as dummy gate pattern 11, as shown in FIGS. 3C and 3D.

Figure 3F:
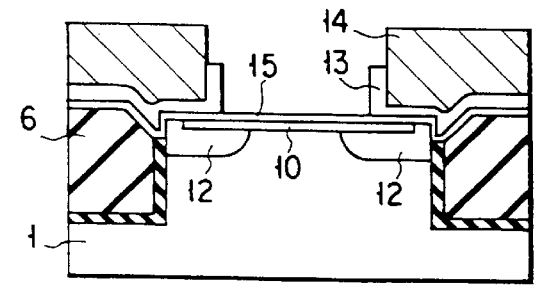

Next, insulating film 14 and silicon nitride film 13 are removed by using a CMP method, so that the top of the dummy gate pattern 11 may be exposed. Then, the dummy gate pattern 11 and the silicon oxide film 15 are removed by etching, as shown in FIGS. 3E and 3F.

As is seen from FIG. 3E, due to the etching effect to remove the silicon oxide film 15, the element insulating film 6 has been further deeply scooped away at the portions contacting the side surfaces of element forming region, in comparison with the state when the process of FIG. 1H has been performed.

In the above step, the portions of element insulating film 6 in a boundary region including the boundary between the element forming region and the element isolating region has been further deeply scooped. Thus, if a gate insulating film is formed thereon, the film 6 will steeply be curved in the boundary region, with the result that a heavy electric field concentration may be caused at the steeply curved portion.

Under the above condition, the embodiment of the present invention enables formation of a gate insulating film having a suitable thickness in the boundary region in a self-alignment manner, so that there can be provided a gate insulating film that can withstand a heavy electric field concentration and that is a high reliability.

As described above, according to this embodiment, after nitrogen is selectively doped into the central flat portion of the silicon substrate 1 in the element forming region, the gate insulating film 8 having a large film thickness in the corner portion can be formed in a self-alignment manner by effecting the heat treatment in an atmosphere containing an oxidizing agent, and as a result, an increase in the number of steps (time for effecting the steps) can be suppressed. In addition, in a case that the present invention is used in combination with a damascene gate method, there can be provided a MOS transistor with a high reliability.

Second Embodiment

FIGS. 4A to 4G are cross sectional views showing the steps of a method for manufacturing a MOS transistor according to a second embodiment of this invention. Those figures show cross sections taken along a line passing across the gate electrode and set in parallel to the gate length direction. Further, portions which correspond to those shown in FIGS. 1A to 1J are denoted by the same reference numerals as in FIGS. 1A to 1J and therefore a detail explanation thereof is omitted herein.

Figure 4A:
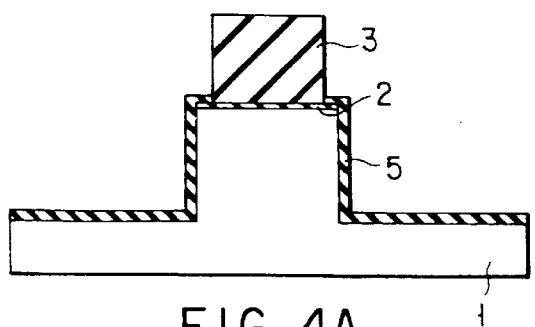
FIGS. 4A to 4G are cross sectional views showing the steps of a method for manufacturing a MOS transistor according to the second embodiment of this invention.
Figure 4E:
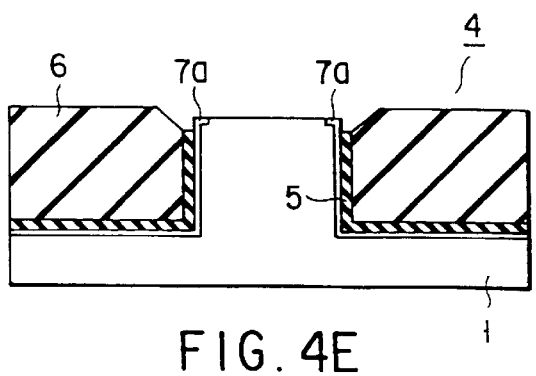
Figure 4B:
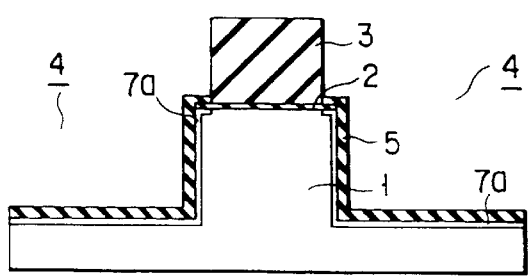

First, after the process from the step of FIG. 1A to the step of FIG. 1D in the above first embodiment is effected, nitrogen is doped into the surface of a portion of a silicon substrate 1 which is covered with a silicon oxide film 5, by using the thermal nitriding method with $NH_3$ gas, as shown in FIGS. 4A and 4B. In FIG. 4B, a reference numeral 7a indicates the region in which nitrogen is doped (nitrogen doped region).

Like the first embodiment, doping of nitrogen may be implemented by using the thermal nitriding method with $N_2O$ gas, NO gas or the like, the radical nitriding method with a nitrogen radical, or the ion introduction technique with a nitrogen ion.

Figure 4F:
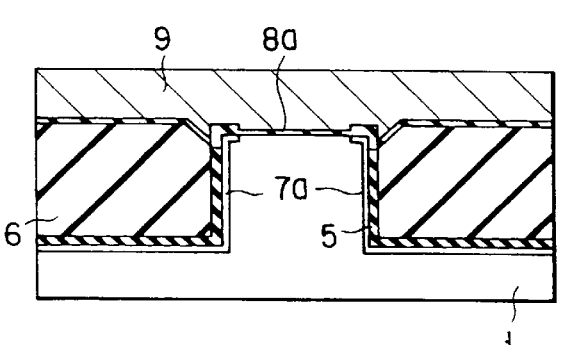
Figure 4C:
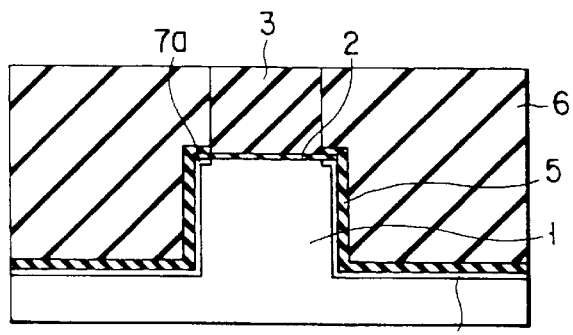

Next, as shown in FIG. 4C, an element isolating film (silicon oxide film) 6 is filled in the internal portions of grooves formed of element isolating grooves 4 and a silicon nitride film 3 and silicon oxide film 2 lying thereon so as to make the surface of the structure flat.

Figure 4G:
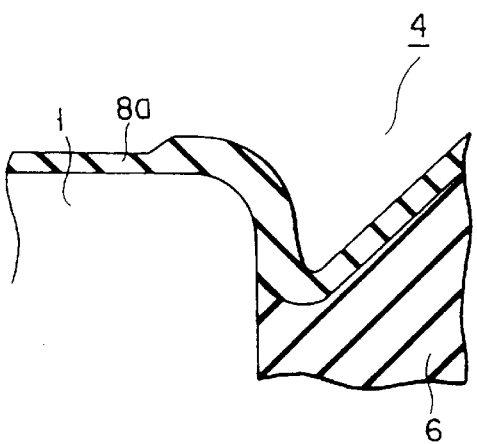
Figure 4D:
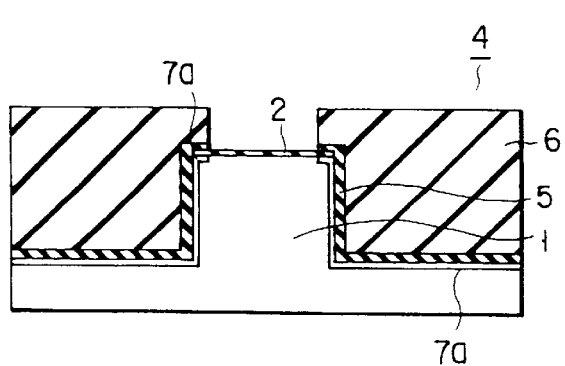

Then, as shown in FIG. 4D, after the surface of the element isolation insulating film (silicon oxide film) 6 is retreated by use of an ammonium fluoride solution and the silicon nitride film 3 is removed by use of a hot phosphoric acid.

Next, as shown in FIG. 4E, a portion of the silicon substrate 1 in the element forming region and a portion of the silicon substrate 1 corresponding to the upper-end corner portion of the element isolating groove 4 are exposed by retreating the surface of the element isolation insulating film (silicon oxide film) 6 substantially to the surface of the silicon substrate and removing the silicon oxide film 2 by use of a dilute hydrofluoric acid.

Next, as shown in FIG. 4F, a silicon nitride film (gate insulating film) 8 is formed on the surface of the silicon substrate 1 by the LPCVD method using mixed gas of $NH_3$ and $SiH_2Cl_2$.

In this case, if the silicon nitride film (gate insulating film) 8a is formed by deposition with an LPCVD method in a manner such that the thickness is 8 nm at the central flat portion (nitrogen doped region 7a) of the silicon substrate 1 in the element forming region, the silicon nitride film (gate insulating film) 8 will have a greater thickness of 10 nm at the corner portion defined between the upper-end corner portion of the side wall of the element isolating groove 4 and the end portion (a region in which nitrogen is not doped) of the element forming region formed in contact therewith as shown in FIG. 4G.

Figure 5:
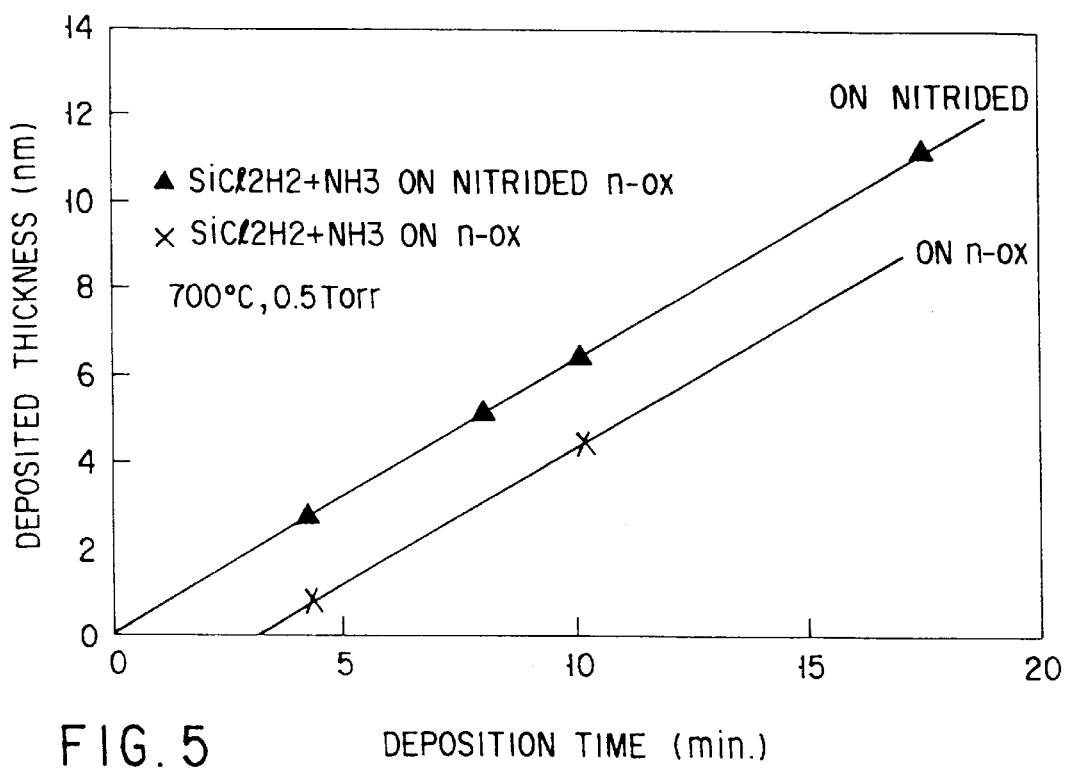
FIG. 5 is a graph showing the relationships of deposition time and silicon nitride film thickness in a case where nitridation is performed and in a case where nitridation is not performed.

The reason why the film becomes thicker at the corner portion is that nitrogen is doped in the corner portion and the reaction time of the initial period of deposition is thus short. FIG. 5 shows the relations between a silicon nitride film thickness and a deposition time in a case where nitrogen is doped in the substrate, and in a case where it is not doped. According to this, a silicon nitride film grows immediately when a deposition is started in a case where nitrogen is doped, while it takes about 5 minutes before a silicon nitride film start to grow in a case where nitrogen is not doped. This time delay of film deposition will provide a difference in the thickness of the silicon nitride film.

That is, according to this embodiment, the silicon nitride film (gate insulating film) 8a whose film thickness is larger on the surface of the silicon substrate 1 in the corner portion than on the surface of the central flat portion of the silicon substrate 1 in the element forming region can be formed in a self-alignment manner.

Next, as shown in FIG. 4F, an amorphous silicon film 9 with a thickness of 100 nm which contains boron as impurity with high impurity concentration and which will be used as a gate electrode is formed by use of the LPCVD method.

After this, like the normal MOS transistor manufacturing method, the processes for patterning the gate electrode, forming source and drain diffusion layers and forming wirings are effected to complete the MOS transistor.

As described above, according to this embodiment, after nitrogen is selectively doped into the corner portion without doping nitrogen into the central flat portion of the silicon substrate 1 in the element forming region, the silicon nitride film (gate insulating film) 8a having a large film thickness on the corner portion can be formed in a self-alignment manner by depositing silicon nitride, and as a result, an increase in the number of steps (time for effecting the steps) can be suppressed. In addition, the same effect as that in the first embodiment can be attained.

In this embodiment, the silicon nitride film is used as the gate insulating film and the doped amorphous silicon film is used as the gate electrode, but even if an insulating film of laminated structure including a silicon nitride film (lower layer) and a $Ta_2O_5$ film (upper layer) is used as the gate insulating film and an Ru film is used as the gate electrode, the breakdown voltage of the gate insulating film in the corner portion can be enhanced since the silicon nitride film formed as the lower layer is made thick in the corner portion.

Third Embodiment

Figure 6A:
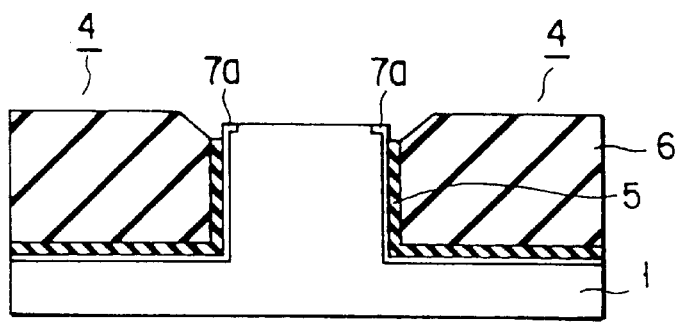
FIGS. 6A to 6C are cross sectional views showing the steps of a method for manufacturing a MOS transistor according to the third embodiment of this invention.
Figure 6B:
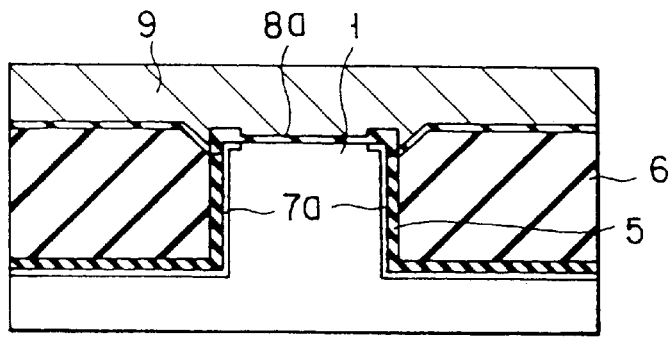
Figure 6C:
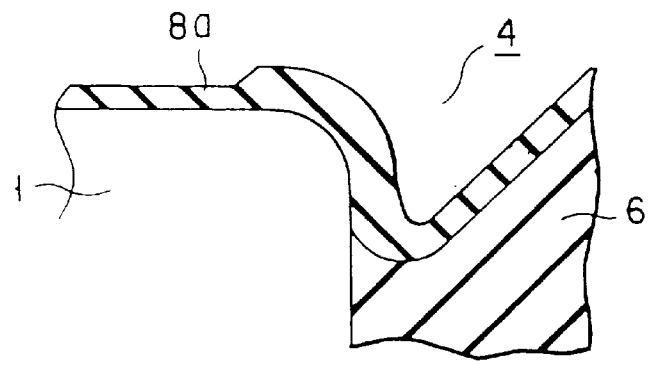

FIGS. 6A to 6C are cross sectional views showing the steps of a method for manufacturing a MOS transistor according to a third embodiment of this invention. Those figures show cross sections taken along a line passing across the gate electrode and set in parallel to the gate length direction. Further, portions which correspond to those of FIGS. 4F to 4G are denoted by the same reference numerals as in FIGS. 4E to 4G, and therefore a derail explanation thereof is omitted herein.

First, after the process up to the step) of FIG. 4E in the second embodiment is effected (FIG. 6A), an underlying silicon nitride film (not shown) is formed on the surface of a silicon substrate 1 by the nitriding method with a nitrogen radical, $NH_3$ gas or NO gas, for example, as shown in FIG. 68, and then a silicon nitride film (gate insulating film) 8a with a thickness of 4 nm is formed on the underlying silicon nitride film by use of the LPCVD method with a mixed gas of $NH_3$ and $SiH_2Cl_2$.

If the underlying silicon nitride film is formed in a manner such that the thickness thereof at the central flat portion of the silicon substrate 1 in the element forming region is approx. 1 nm, the underlying silicon nitride film with a thickness of 2 nm is formed on the corner portion which is a portion lying between the upper-end corner portion of the side wall of an element isolation groove 4 and the end portion of the element forming region formed in contact therewith. The reason why the film thickness at the corner portion becomes larger is that a nitrogen doped region 7a has been formed on this portion.

Therefore, as shown in FIG. 6C, the total thickness (5 nm) of the underlying silicon nitride film (1 nm) and the gate insulating film (silicon nitride film) 8a (4 nm) at the central flat portion of the silicon substrate 1 in the element forming region is smaller than the total thickness (6 nm) of the underlying silicon nitride film (2 nm) and the gate insulating film (silicon nitride film) 8a (4 nm) on the corner portion on the silicon substrate 1.

That is, according to this embodiment, the gate insulating film (silicon nitride film 8a+underlying silicon nitride film) of which the film thickness on the corner portion is larger than that at the central flat portion of the silicon substrate 1 in the element forming region can be formed in a self-alignment manner.

Next, as shown in FIG. 6B, an amorphous silicon film 9 with a thickness of 100 nm which contains boron as impurity with high impurity concentration and which will be used as a gate electrode is formed by use of a LPCVD method.

After this, similar to the normal MOS transistor manufacturing process, the processes for patterning the gate electrode, forming source and drain diffusion layers and forming wirings are effected to complete the MOS transistor.

As described above, according to this embodiment, after nitrogen is selectively doped into the corner portion without doping nitrogen into the central flat portion of the silicon substrate 1 in the element forming region, the silicon nitride film (gate insulating film) 8a having a large film thickness at the corner portion can be formed in a self-alignment manner by nitriding the surface of the silicon substrate 1, and as a result, an increase in the number of steps (time for effecting the steps) can he prevented. In addition, the same effect as that of the first embodiment can also be attained.

If the silicon oxide film 2 is removed after the step of FIG. 3D and then the nitriding process for forming the underlying silicon nitride film is effected after a chemically grown film is formed on the surface of the silicon substrate 1 in the element forming region, there can be provided an underlying silicon nitride film having a larger difference between the film thickness at the corner portion and the film thickness at the central flat portion of the element forming region due to suppression of nitration by the presence of the chemically grown film, and the effect that the fixed charge density in the underlying silicon nitride film formed is reduced can be attained.

Further, this embodiment uses the silicon nitride film 8a as the gate insulating film formed by the deposition method, and also uses the doped amorphous silicon film as the gate electrode, but a $Ta_2O_5$ film or BSTO film formed by the deposition method may be used as the gate insulating film, and an Ru film may be used as the gate electrode, for example. In a case where they are used, the breakdown voltage of the gate insulating film in the corner portion can be enhanced since the underlying silicon nitride film is made thick at the corner portion. Further, a silicon nitride film of single layer structure formed by nitriding the surface of the silicon substrate may be used as the gate insulating film.

Fourth Embodiment

FIGS. 7A to 7G are cross sectional views showing the steps of a method for manufacturing a MOS transistor according to the fourth embodiment of this invention. Those figures show cross sections taken along a line passing across the gate electrode and set in parallel to the gate length direction. Further, portions which correspond to those of FIGS. 1A to 1G are denoted by the same reference numerals as in FIGS. 1 and 2, and therefore a detail explanation thereof is omitted herein.

First, after the process from the step of FIG. 1A to the step of FIG. 1D in the first embodiment is effected (FIG. 7A), ion of an element such as silicon, helium, neon, argon, krypton, xenon, nitrogen or oxygen is doped into the surface of a portion of the silicon substrate 1 which is covered with a silicon oxide film 5 to make the surface into an amorphous form. In FIG. 7B, reference numeral 10 indicates a silicon region (amorphous silicon region) which is made into the amorphous form.

If silicon, which is the same as the constituent element of the silicon substrate 1, is selected as a doped element, the device characteristic is not influenced since reaction of the doped element (silicon) and the silicon substrate 1 does not occur.

Figure 7A:
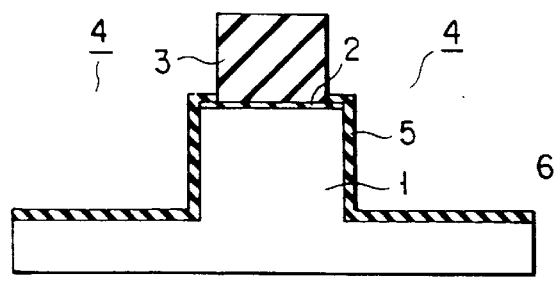
FIGS. 7A to 7G are cross sectional views showing the steps of the method for manufacturing the MOS transistor according to the fourth embodiment of this invention.
Figure 7E:
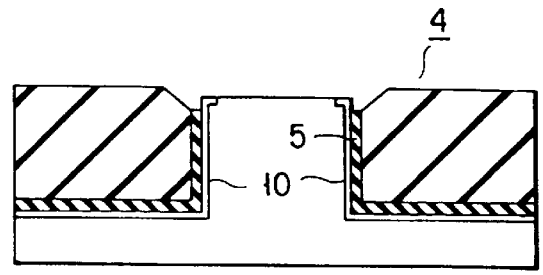
Figure 7B:
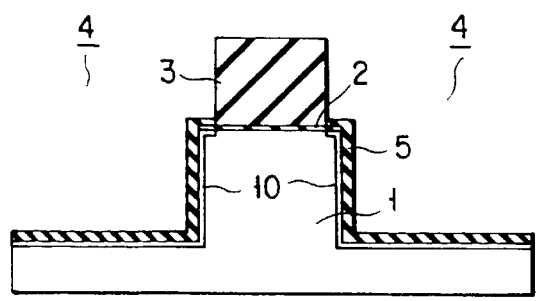
Figure 7F:
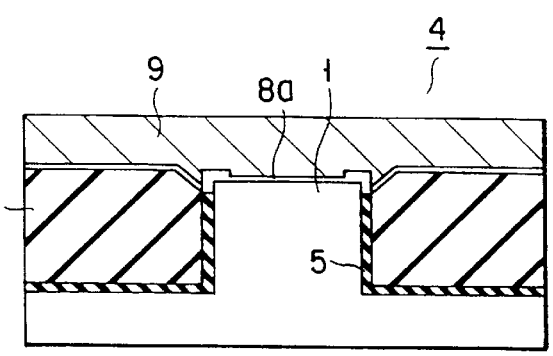
Figure 7C:
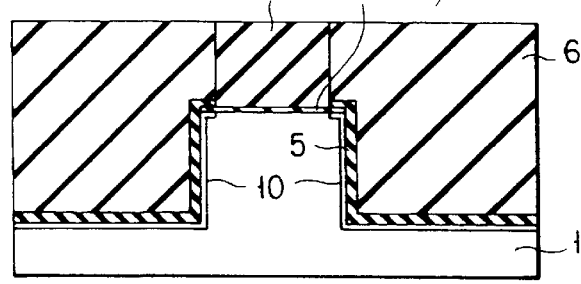

Next, as shown in FIG. 7C, an element isolation insulating film (silicon oxide film) 6 is filled into grooves formed of the element isolation grooves 4 and the silicon nitride film 3 and silicon oxide film 2 lying thereon, and then the surface of the structure is made flat.

Figure 7G:
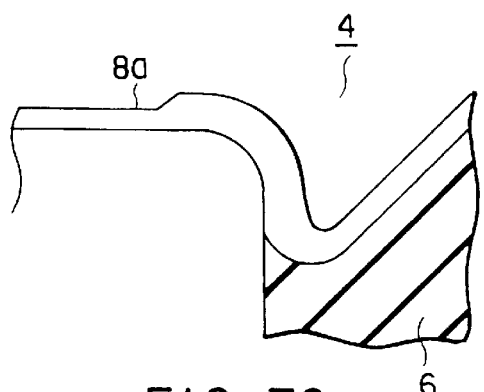
Figure 7D:
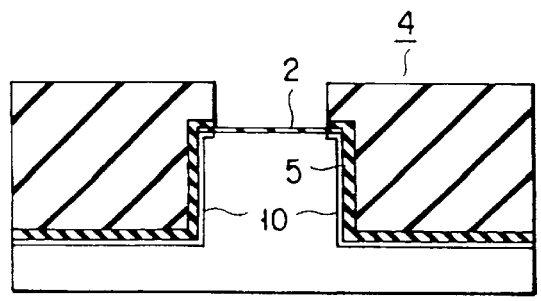
Figure 9A:
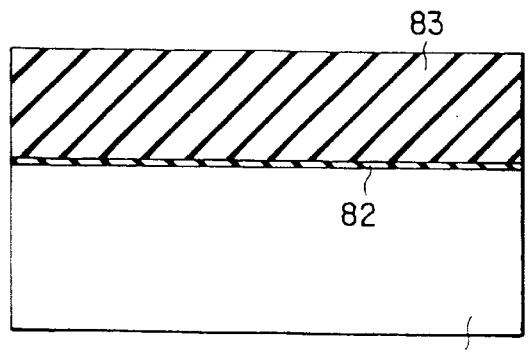
FIGS. 9A to 9H are cross sectional views showing the steps of a method for manufacturing a conventional MOS transistor.
Figure 9E:
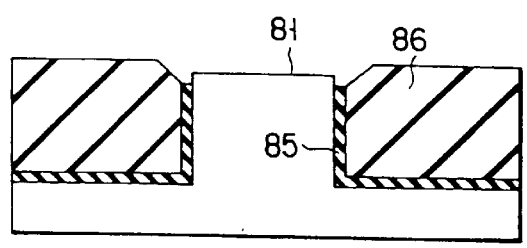
Figure 9B:
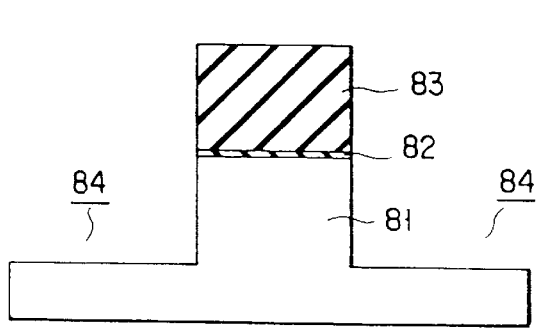
Figure 9F:
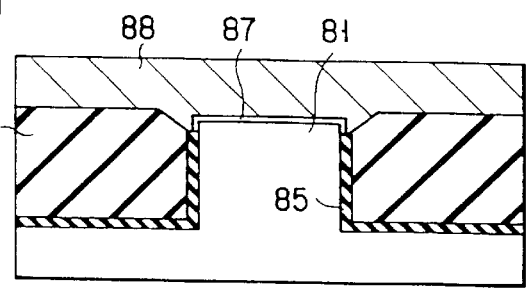
Figure 9C:
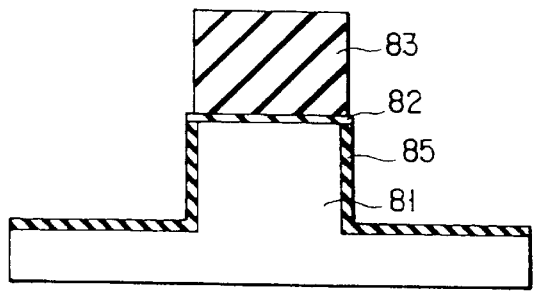
Figure 9G:
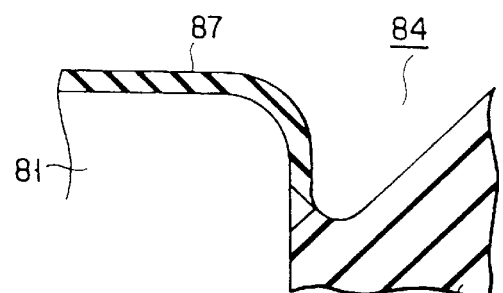
Figure 9D:
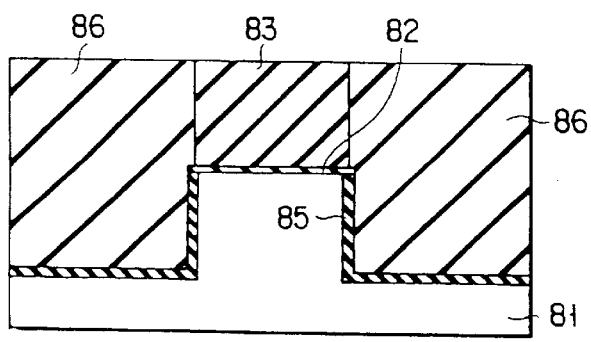
Figure 9H:
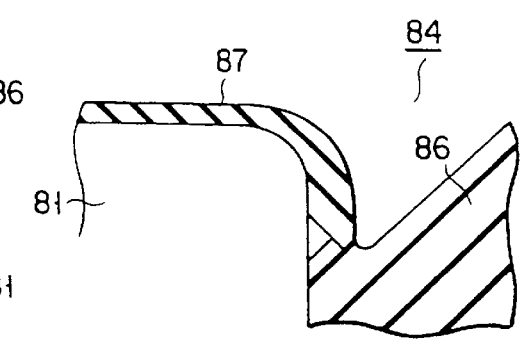

Next, as shown in FIG. 7D, the surface of the element isolation insulating film (silicon oxide film) 6 is retreated by use of an ammonium fluoride solution, and then the silicon nitride film 3 is removed by use of a hot phosphoric acid.

Next, as shown in FIG. 7E, the surface of the element isolating film (silicon oxide film) 6 is retreated substantially to the surface of the substrate, and the silicon oxide film 2 is removed by use of a dilute hydrofluoric acid to expose a portion of the silicon substrate 1 in the element forming region and a portion of the silicon substrate 1 in the boundary region including the upper-end corner portion of the side wall of the element isolating groove 4.

In this case, the process from the step of forming the amorphous silicon region 10 to the above step effected should not be performed at a high temperature. This is because the amorphous silicon region 10 at the corner portion which is lying an region (boundary region) defined between the upper-end corner portion of the side wall of the element isolating groove 4 and the end portion of the element forming region formed in contact therewith may be spoiled due to such a process at a high temperature. In order to serve the above purpose, it is preferable to dope ion of an element such as oxygen or nitrogen which makes solid-phase growth speed low, so as to form the amorphous silicon region 10.

Next, as shown in FIG. 7F, an underlying silicon nitride film (not shown) is formed on the exposed surface of the silicon substrate 1 in the element forming region by the nitriding method with a nitrogen radical, $NH_3$ gas or NO gas, for example, a silicon nitride fill (gate insulating film) 8a of 5 nm thickness is formed on the underlying silicon nitride film by use of the LPCVD method with a mixed gas of $NH_3$ and $SiH_2Cl_2$.

In this case, if the underlying silicon nitride film is formed such that the thickness thereof on the central flat portion of the silicon substrate 1 in the element forming region is approx. 1 nm, the underlying silicon nitride film with a thickness of approx. 2 nm is formed at the corner portion which is a portion lying between the upper-end corner portion of the side wall of the element isolation groove 4 and the end portion of the element forming region formed in contact therewith. The reason why the film thickness on the corner portion becomes larger is that the amorphous silicon region 10 has been formed in this portion and thus nitriding reaction may easily be caused therein.

Therefore, as shown in FIG. 7G, the total thickness (5 nm) of the underlying silicon nitride film (1 nm) and the gate insulating film (silicon nitride film) 8 (4 nm) on the central flat portion of the silicon substrate 1 in the element forming region is smaller than the total thickness (6 nm) of the underlying silicon nitride film (2 nm) and the gate insulating film (silicon nitride film) 8 (4 am) at the corner portion in the boundary region.

That is, according to this embodiment, the gate insulating film (silicon nitride film 8+underlying silicon nitride film) of which the film thickness on the surface of the silicon substrate 1 at the corner portion is larger than the film thickness on the surface of the central flat portion of the silicon substrate 1 in the element forming region can be formed in a self-alignment manner.

Next, as shown in FIG. 7F, an amorphous silicon film 9 with a thickness of 100 nm which contains boron as impurity with high impurity concentration and which will be used as a gate electrode is formed by use of the LPCVD method.

After this, similar to a conventional MOS transistor manufacturing method, the processes for patterning the gate electrode, forming source and drain diffusion layers and forming wirings are effected to complete the MOS transistor.

As described above, according to this embodiment, the silicon nitride film (gate insulating film) 8 having a large film thickness at the corner portion in the boundary region can be formed in a self-alignment manner by nitriding the surface of the silicon substrate after the corner portion is formed into an amorphous form without changing the central flat portion of the silicon substrate 1 in the element forming region into an amorphous form, and as a result, an increase in the number of steps (time for affecting the steps) can be avoided. In addition, the same effect as that of the first embodiment can be attained. Further, the same modification as that of the third embodiment can be applied to this embodiment.

This invention is not limited to the above embodiments. For example, in the above embodiments, a case wherein STI is used as the element isolation technique is explained, but this invention is effective when LOCOS is used as the element isolation technique.

Figure 8:
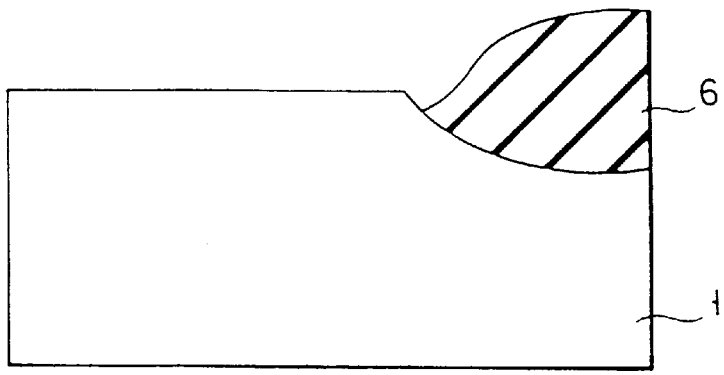
FIG. 8 is a cross sectional view for illustrating a modification of this invention.

In a case where LOCOS is used, since the silicon oxide film (element isolation film) 2 on the end portion of the element isolation region formed in contact with the element forming region is removed when a cap silicon oxide film under the silicon nitride film is removed as shown in FIG. 8, the same problem as that occurring in the case of STI occurs if the gate insulating film is formed in this state, but the problem does not occur if the gate insulating film is formed according to this invention.

Further, though the above-described embodiments are explained in relation to a MOS transistor, this invention also is applicable to a MIS type capacitor element. That is, a highly reliable MIS type capacitor element, in which a lowering in the breakdown voltage in the corner portion is suppressed, can be attained by omitting the source and drain diffusion layers from the MOS transistor in each of the above embodiments.

Further, this invention can be variously modified without departing from the technical scope thereof.

As described above, according to this invention, since a gate insulating film (a silicon nitride film, a silicon oxide film containing nitrogen or a laminated film including the above films) in which the film thickness on the boundary region defined between the element forming region and the element isolating region is larger than the film thickness in a region of the element forming region can be formed in a self-alignment manner, a lowering is a the breakdown voltage of the gate insulating film in the boundary region between the element forming region and the element isolating region can be suppressed without causing an increase in the number of steps (time for effecting the steps) and the manufacturing cost.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for manufacturing a semiconductor device, comprising:

forming a film on a silicon substrate;

sequentially etching the film and the silicon substrate to form an element isolating groove, an element forming region being surrounded by the element isolating groove and a residual part of the film on the element forming region;

selectively etching a side wall of the residual part of the film to expose an upper end portion of the element forming region;

forming a nitrogen doping mask on the silicon substrate, the nitrogen doping mask having an opening corresponding to the residual part of the film and having a width less than a width of the element forming region;

forming a nitrogen doped region on the element forming region through the opening of the nitrogen doping mask;

removing partially the nitrogen doping mask to expose a surface of the nitrogen doped region, the upper end portion of the element forming region and the upper side wall of the element forming region; and forming a gate insulating film on the exposed surface of the nitrogen doped region, the upper end portion of the element forming region and an upper side wall of the element forming region, by heat treatment in an atmosphere containing an oxidizing agent, a resulting thermal oxidation film having a first portion corresponding to the surface area of the nitrogen doped region and a second portion corresponding to the exposed upper end portion of the element forming region and the upper side wall of the element forming region, and the second portion having a thickness larger than a thickness of the first portion.

2. The method according to claim 1, wherein said nitrogen doping mask is formed by:

covering the element isolating groove, the element forming region and the residual part of the film on the element forming region by an element isolation insulating film; and removing the residual part of the film to form the opening in the element isolation insulating film.

3. The method according to claim 1, wherein said gate insulating film has a laminated structure including a nitrided silicon oxide film.

4. The method according to claim 1, wherein said nitrogen doped region is formed by doping radical nitrogen on the surface of the element forming region.

5. The method according to claim 1, wherein the nitrogen doped region is formed by doping nitrogen ions by using an ion-implantation method.

* * * * *